United States Patent
Cai et al.

(10) Patent No.: US 12,278,175 B2
(45) Date of Patent: Apr. 15, 2025

(54) PLATFORM POWER INTEGRITY DESIGN INCLUDING PACKAGE STANDARD POWER INTEGRITY MODEL AND COMPACT VOLTAGE REGULATOR MODULE MODEL

(71) Applicant: Intel Corporation, Santa Clara, CA (US)

(72) Inventors: Xing Jian Cai, Palo Alto, CA (US); Chi-Te Chen, Folsom, CA (US); Wei Qian, Folsom, CA (US); Yihong Yang, Portland, OR (US); Jue Chen, Los Gatos, CA (US); Long Wang, El Dorado Hills, CA (US); Chung-Hao Joseph Chen, Portland, OR (US); Su Mi Sam, Portland, OR (US); Srinivas Thota, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 781 days.

(21) Appl. No.: 17/359,514

(22) Filed: Jun. 26, 2021

(65) Prior Publication Data

US 2021/0327801 A1    Oct. 21, 2021

(51) Int. Cl.
| | | |
|---|---|---|
| *G06F 30/20* | (2020.01) | |
| *G05F 1/66* | (2006.01) | |
| *G06F 30/39* | (2020.01) | |
| *H01L 23/50* | (2006.01) | |
| *H01L 23/528* | (2006.01) | |

(52) U.S. Cl.
CPC ............. *H01L 23/50* (2013.01); *G05F 1/66* (2013.01); *G06F 30/20* (2020.01); *G06F 30/39* (2020.01); *H01L 23/5286* (2013.01)

(58) Field of Classification Search
USPC .......................................................... 716/133
See application file for complete search history.

(56) References Cited

U.S. PATENT DOCUMENTS

| | | | | |
|---|---|---|---|---|
| 2019/0317285 A1* | 10/2019 | Liff | ...................... | G02B 6/2938 |
| 2020/0042667 A1* | 2/2020 | Swaminathan | ....... | G06F 30/367 |

* cited by examiner

*Primary Examiner* — Bryce M Aisaka
(74) *Attorney, Agent, or Firm* — Schwegman Lundberg & Woessner, P.A.

(57) ABSTRACT

Some embodiments include apparatuses and electrical models associated with the apparatus. One of the apparatuses includes an integrated circuit having a die; a package substrate; first conductive connections coupled between the die and a first side of the package substrate; second conductive connections located on a second side of the package substrate opposite from the first side. The second conductive connections are coupled to the first conductive connections through conductive paths in the package substrate. The first conductive connections and the conductive connections are associated with an S-parameter of an electrical model of the integrated circuit package. The electrical model further includes at least one of a current value associated with a power rail of the integrated circuit package, an impedance target associated with a location at the integrated circuit package, and a mapping associated with the first and second conductive connections.

21 Claims, 7 Drawing Sheets

PLATFORM POWER INTEGRITY DESIGN INCLUDING PACKAGE STANDARD POWER INTEGRITY MODEL AND COMPACT VOLTAGE REGULATOR MODULE MODEL

TECHNICAL FIELD

Embodiments described herein pertain to power delivery network (PDN) and power integrity (PI) in electronic systems. Some embodiments relate to integrated circuit (IC) package model and voltage regular module (VRM) model in platform PI design.

BACKGROUND

Computers, tablets, cellular phones, and many other electronic systems (e.g., products) often have devices (e.g., IC package) located on a circuit board. The system has a power delivery network (PDN) to provide power for the devices. Power integrity of the PDN involves the management of power in the circuit board to ensure that power delivered to the devices satisfies specified requirements of all the devices. Platform (board-level) PI design is often performed by designers of an entity that is different from the manufacturers (vendors) of devices on the circuit board. Manufacturers of the devices often provide limited information of the devices to platform PI designers to avoid disclosing sensitive device intellectual property. With such limited information, platform PI design process can be inefficient and may result in higher system cost.

DETAILED DESCRIPTION

The techniques described herein relate to platform (board-level) PI design. Aspects of the described techniques include a PSPI model for an IC package, a compact VRM model for a VRM (Voltage Regulator Module) or a PMIC (Power Management Integrated Circuit Chip), and combiner that combines the PSPI model and the VRM model to provide a fast PI simulation architecture, framework, flow and tool, for platform PI design.

Chip vendors (e.g., IC package manufacturer) are often hesitant to provide enough package-level PI design collaterals for supporting platform designers to protect sensitive intellectual property information. Chip vendors usually provide platform design guidelines such as capacitors bill of material (BOM) and recommended placements in terms of physical equivalence design requirements, based upon reference design with the recommended stack-up. The platform designers often have no other choice but to copy exactly from the reference design. Thus, there is neither flexibility to make trade-off between performance and cost, nor supporting platform differentiation of from factor, in terms of stack-up and power rail routings. The platform designers lack design criteria from chip vendors, to review whether each power rail is good enough from an electrical equivalence perspective, to optimize whether there are capacitors to remove to eliminate the extra margin and save BOM cost, or to make a trade-off between performance and cost in terms of stack-ups routing areas, and capacitors. Consequently, this can result in many different platform design guidelines that need to be individually-addressed, in terms of design, optimization, review and sign-off, and that require tremendous resources with power integrity expertise, which is unsustainable.

To mitigate platform PI design challenges mentioned above, chip vendors may provide detailed package-level PI design relevant collaterals, including package physical database, chip-level power grid, on-die current profiles and noise targets, to platform designers (e.g., customers) who have enough PI design expertise and resources. Then, platform PI designers handle the detailed platform PI design, optimization, and review/sign-off. However, providing such detailed package-level PI design can risk leaking critical and sensitive IP information from chip vendors to competitors through platform designers.

An alternative option can include platform designers (e.g., customers) sharing their platform designs with chip vendors. Then, power integrity engineers of the chip vendors can perform a majority of the platform design, optimization, review and sign-off. However, this alterative option could take vendors tremendous power integrity design resources to individually support numerous platform differentiation for many customer product innovations, which can be unsustainable for chip vendors since a single client product may fit into a large number (e.g., in the hundred range) of differential platforms.

As mentioned above, the techniques described herein include a PSPI model for an IC package (e.g., a chip). As described in more detail below, the PSPI model contains enough information to allow efficient platform PI design without revealing sensitive intellectual property information of the IC package. The compact VRM model of the techniques described herein can further improve the efficiency of the platform PI design and may reduce system cost. The PSPI model and the compact VRM model can be combined to provide a fast PI design, which is an efficient and cost-effective platform PI design. Other improvements and benefits of the described techniques are discussed below with reference to FIG. 1 through FIG. 9.

Figure 1:
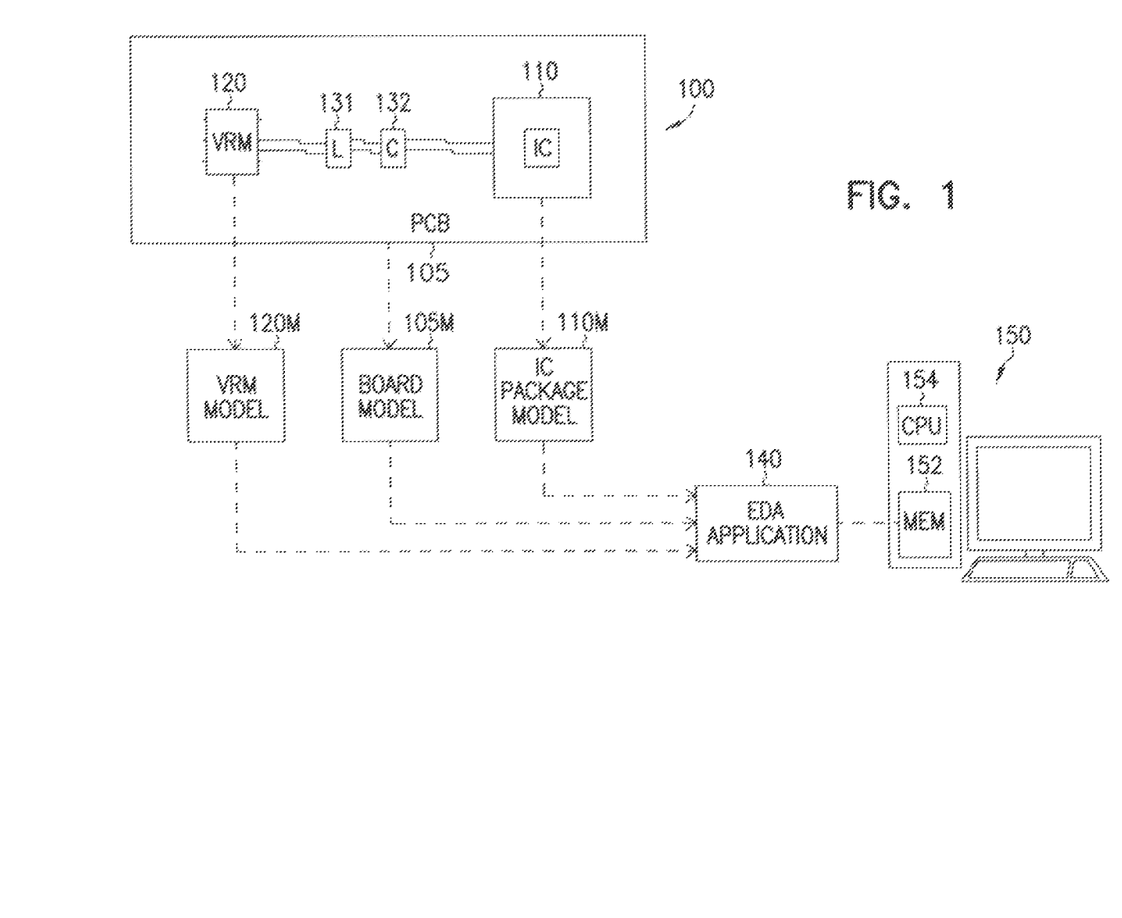
FIG. 1 shows an apparatus in the form of a system and associated electronic design automation (EDA) application, according to some embodiments described herein.

FIG. 1 shows an apparatus in the form of a system 100 according to some embodiments described herein. System 100 (shown in top view) can include an IC package 110, a VRM 120, an inductor (L) 131, a capacitor (C) 132, and a circuit board 105 on which the elements of system 100 are located. Circuit board 105 can include a printed circuit board (PCB) or other types of circuit boards. Circuit board 105 can include conductive paths (e.g., metal traces) to deliver power from VRM 120 to IC package 110. VRM 120, inductor 131, capacitor 132, and conductive paths of circuit board 105 can be part of a PDN of system 100.

System 100 can include or be included in a computer (e.g., server, desktop, laptop, or notebook), a tablet, a cellular phone, internet of things (IoT), or other electronic devices or systems. System 100 can include or can be part of a system on chip (SoC), system on package (SiP), or other types of electronic systems. One skilled in the art would recognize that FIG. 1 system 100 also includes other components that are omitted from FIG. 1 for simplicity.

As shown in FIG. 1, circuit board 105, IC package 110, and VRM 120 can include electrical models (e.g., electrical equivalents) 105M, 110M, and 120M, respectively. Electrical models 105M, 110M, and 120M can be provided by manufacturers of circuit board 105, IC package 110, and VRM 120, respectively. The manufacturers of circuit board 105, IC package 110, and VRM 120 can be different from each other. During a design stage of system 100, electrical models 105M, 110M, and 120M can be used (e.g., used as input information) as part of a platform PI design process to design PDN of system 100.

In FIG. 1, an electronic design automation (EDA) design tool 140 (EDA application 140) can be used to simulate electrical models 105M, 110M, and 120M. EDA application 140 can be used during platform PI design of system 100 based in part on electrical models 105M, 110M, and 120M. EDA application 140 can include programming software (e.g., instruction sets and subroutines) that can be stored on a storage device 152 (e.g., a memory device (labeled MEM).

Storage device 152 can include a non-transitory computer-readable storage medium, which can include any combination of (one or more of) hard disk drives, solid state drives, memory sticks, random access memories (RAM), read-only memories (ROM), and other memory devices. Storage device 152 can be accessed by a computer 150. Storage device 152 can be part of computer 150 or a device separate from computer 150.

Computer 150 can include a processor 154, which can include processing circuitry (e.g., processing circuitry including a central processing unit (CPU)). Processor 154 can operate to execute programming software (e.g., instruction sets and subroutines) of EDA application 140 to perform the process (e.g., platform PI design process) described herein. Thus, as described herein, storage device 152 can include a non-transitory computer-readable storage medium having a plurality of instructions stored thereon, which, when executed by a processor (e.g., processor 154), cause the processor to perform operations and processes (e.g., platform PI design process (e.g., simulation)) described herein. Any of the operations and operative components described herein may be implemented in software, firmware, hardwired circuitry and/or any combination thereof. System 100, including circuit board 105, IC package 110, and VRM 120 and associated electrical models 105M, 110M, and 120M, can include the system (e.g., system 200 in FIG. 2)

and respective circuit board, IC package, VRM, and associated models described below with reference to FIG. 2 through FIG. 9.

Figure 2:
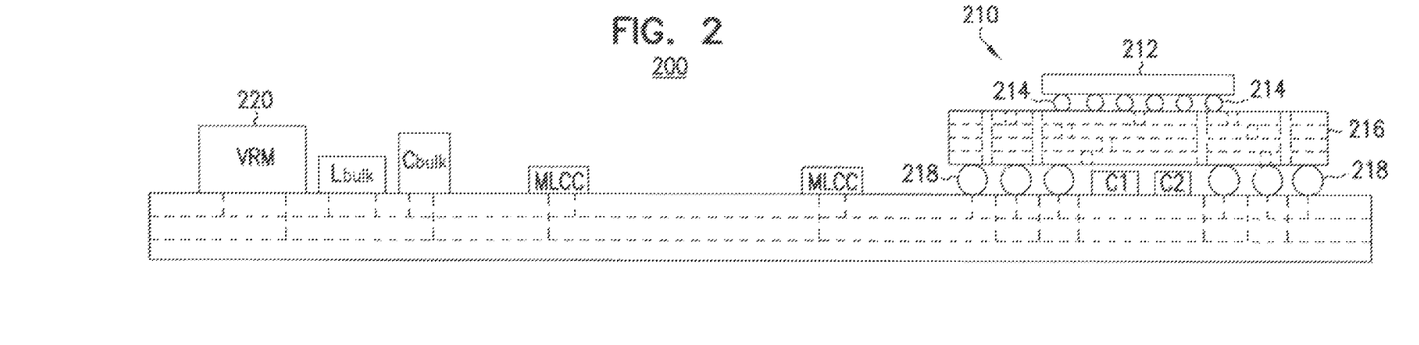
FIG. 2 shows an apparatus in the form of a system including an IC package and VRM module, according to some embodiments described herein.

FIG. 2 shows an apparatus in the form of a system 200, according to some embodiments described herein. As shown in FIG. 2, system 200 (shown in side view) can include a circuit board 205, an IC package 210, a VRM 220, an inductor Lbulk, a capacitor Cbulk, capacitors (e.g., multilayer ceramic capacitor (MLCC)) such as C1 and C2. System 200 can correspond to system 100 of FIG. 1. For example, circuit board 205, an IC package 210, and VRM 220 can correspond to circuit board 105, an IC package 110, and VRM 120, respectively, of FIG. 1.

IC package 210 of system 200 can include a ball grid array (BGA) package, a land grid array (LGA) package, or other types of IC packages. As shown in FIG. 2, IC package 210 can include at least one die (e.g., chip) 212, conductive connections (e.g., solder bumps) 214 attached to die 212, a package substrate (e.g., BGA-type or LGA-type substrate) 216, and conductive connections (e.g., solder balls or pins) 218 attached to package substrate 216. Die 212 can include circuitry of a central processing unit (CPU), graphics processing unit (GPU), or other semiconductor devices.

Conductive connections 218 can be located on another side (e.g., bottom side) of package substrate 216 opposite from the side that conductive connections 214 are located. As shown in FIG. 2, package substrate 216 can have conductive paths (not labeled) inside package substrate 216. Conductive connections 214 and conductive connections 218 can be coupled to each other through the conductive paths in package substrate 216.

As shown in FIG. 2, conductive connections 214 can be located on a side (e.g., top side) of package substrate 216. Conductive connections 214 can be located between and coupled to (e.g., directly coupled to) to die 212 and package substrate 216. Conductive connections 218 can be located on another side (e.g., bottom side) of package substrate 216 opposite from the side that conductive connections 214 are located. Conductive connections 218 can be located between and coupled to (e.g., directly coupled to) package substrate 214 and circuit board 205.

Conductive connections 214 can include solder bumps or other types of conductive connections. Conductive connections 218 can be include solder balls (e.g., BGA connections) or other types of conductive connections. Alternatively (or additional) conductive connections 218 can be part of a socket (e.g., socket external to IC package 210) on circuit board 205 where IC package 210 can be coupled to (e.g., located over) conductive paths on board 205 through conductive connections 218 of the socket. Conductive connections 218 can be include solder balls (e.g., BGA balls) or other types of conductive connections.

Figure 3:
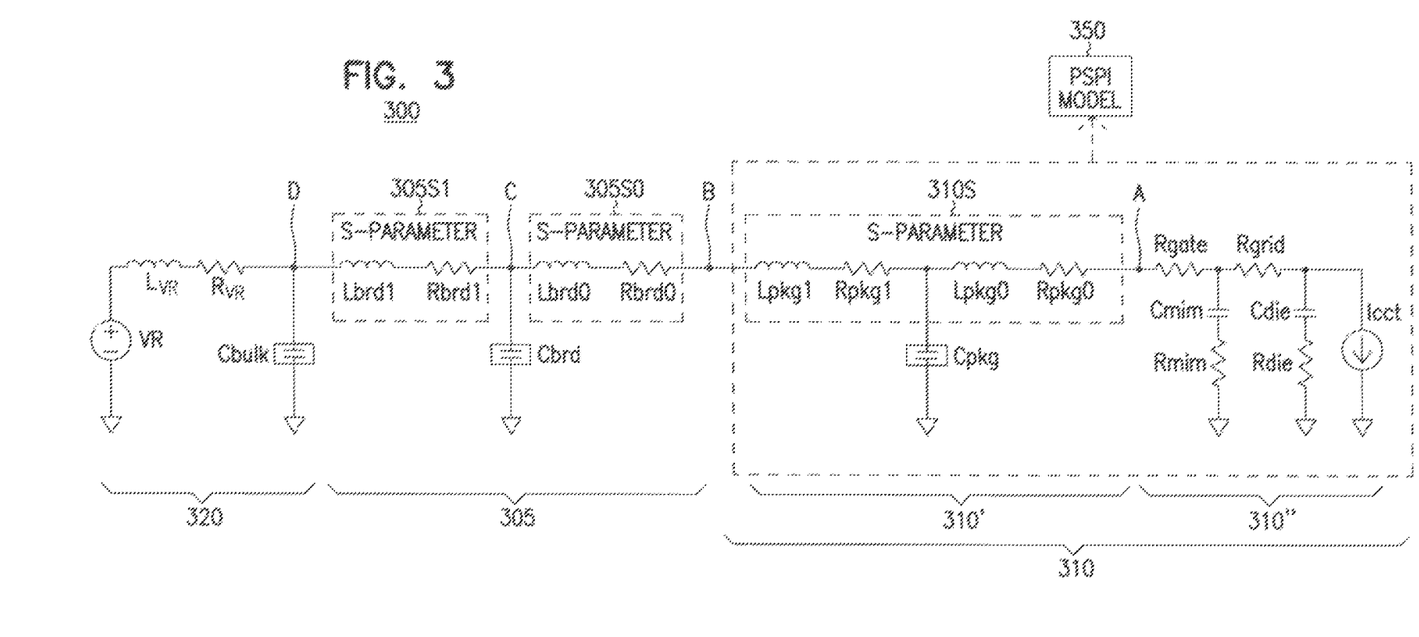
FIG. 3 shows a schematic diagram presenting an electrical equivalence of the system of FIG. 2, according to some embodiments described herein.

FIG. 3 shows a schematic diagram 300 including portions 305, 310, and 320 that present electrical equivalences of respective portions of system 200 of FIG. 2, according to some embodiments described herein. In FIG. 3, portion 305 can represent electrical equivalence of circuit board 205 (FIG. 2). Portion 320 can represent electrical equivalence of VRM 220 (FIG. 2). Portion 310 can represent electrical equivalence of IC package 210 (FIG. 2). Portion 310 includes combination of portions 310' and 310" that can represent different portions of IC package 210. For example, portion 310" can represent on-die electrical equivalent of die 212 (FIG. 2) of IC package 210. As shown in FIG. 3, portions 305, 310, and 320 can include respective inductors Lbrd0, Lbrd1, Lpkg0, Lpkg1, $L_{VR}$, resistors $R_{VR}$, Rbrd0, Rbrd1, Rpkg0, Rpkg1, Rgate, Rgrid, Rmim, and Rdie, capacitors Cbulk, Cbrd, Cpkg, Cmim, and Cdie, voltage source VR, and a current source Icct.

As shown in FIG. 3, portions 305, 310, and 320 can be connected to each other at locations represented by nodes A, B, C, and D. Node A can be located at conductive connections (e.g., solder bumps) 214 of IC package 210. Node B can be located at conductive connections (e.g., solder balls) 218 of IC package 210. Node C can be located at a node on circuit board 205. Node D can be located at an output node of VRM 220 of system 200.

System 200 can include S-parameters (scattering parameters) associated with different portions of system 200. For example, portions 305 can include associated S-parameter (S-parameter model) 305S0 between nodes B and C, and S-parameter (S-parameter model) 305S1 between nodes C and D. Portion 310' can include associated S-parameter (S-parameter model) 310S between nodes A and B. S-parameters 305S0 and 305S1 are part of an electrical model of circuit board 205 (FIG. 2) that can include power net information of circuit board 305. S-parameter 310S can include a power net from conductive connections (e.g., solder bumps) 214 to conductive connections (e.g., solder balls) 218. S-parameters 305S0, 305S1, and 310S associated with system 200 shown in FIG. 3 can be generated using ways known to those skilled in the art.

A package-level standard power integrity (PSPI) model 350 (electrical model 350) can be generated (or created) based on portion 310, which is the electrical equivalent of IC package 210 of FIG. 2. As described in more detail below with reference to FIG. 6A and FIG. 6B, PSPI model 350 can include information contained in different files (e.g., text tiles with specific format (e.g., syntax)). Information from PSPI model 350 can be provided as input (e.g., input information) to EDA design tools (e.g., to EDA application 140 of FIG. 1) for simulation of platform PI design of system 200 (FIG. 2).

Figure 4:
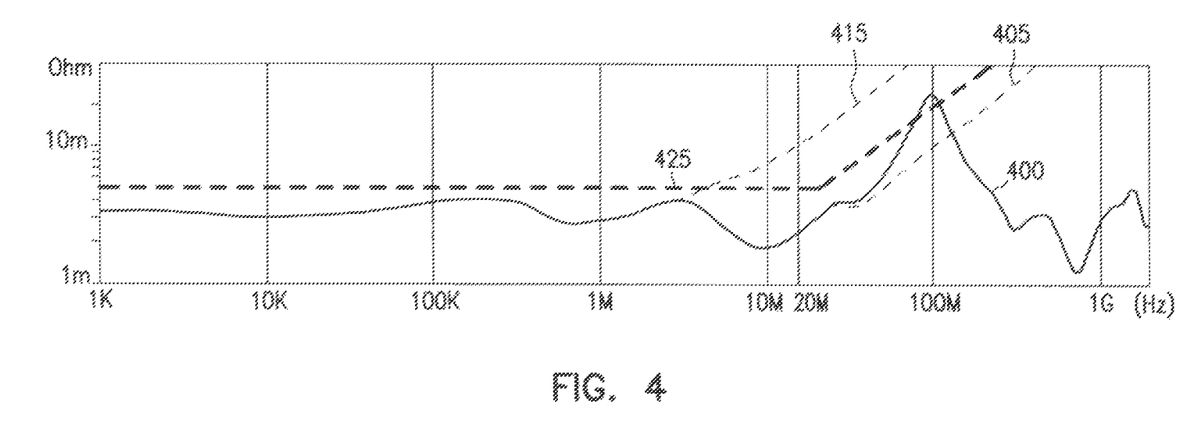
FIG. 4 shows impedance curves relative to frequency of a PDN of the system of FIG. 2, according to some embodiments described herein.

FIG. 4 shows impedance curves relative to frequency of PDN of system 200 (FIG. 2 and FIG. 3), according to some embodiments described herein. In FIG. 4, impedance curves 400, 405, 415, and 425 represent impedance curves of system 200 for full PDN, PDN excluding die 212, PDN excluding IC package 210, and PI design target, respectively. As shown in FIG. 4, impedance curve 400 (for full PDN) can influence impedance up to about 20 MHz (e.g., between DC to about 10 MHz range) with the combined contribution from PSPI model 350 (FIG. 3). Therefore, an impedance target between DC to about 10 MHz for a particular power rail of IC package 210 can be selected to be above impedance values of impedance curves 400 to allow (e.g., to ensure) proper performance of system 200 of FIG. 2. Thus, as shown in FIG. 4, an example impedance target as shown by impendence curve 425 can be selected. The impedance can be scalable for supporting platform trade-off flexibility between performance and cost. For example, the lower value of a tight impedance curve (e.g., resulting from the higher cost of capacitor BOM and/or stack-up) will support higher performance for premium product designs. In another example, the higher value of a relaxed impedance curve (e.g., resulting in low-cost capacitor BOM and/or low-cost stack-up) will support volume/low-cost products.

Figure 5:
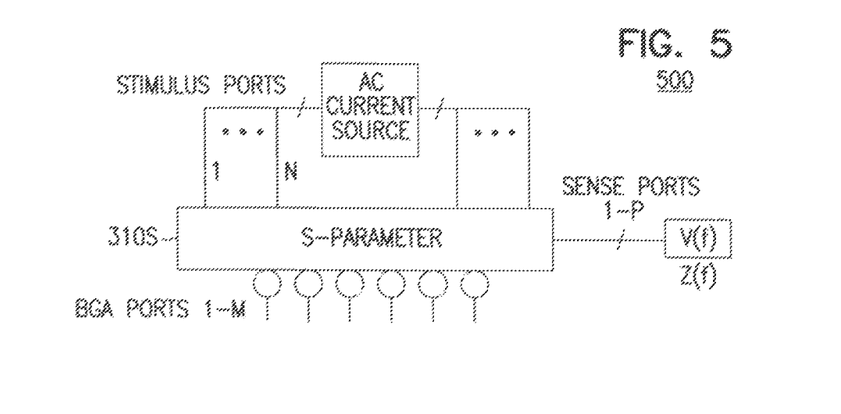
FIG. 5 shows a diagram including elements presenting part of the IC package of the system of FIG. 2, according to some embodiments described herein.
Figure 6A:
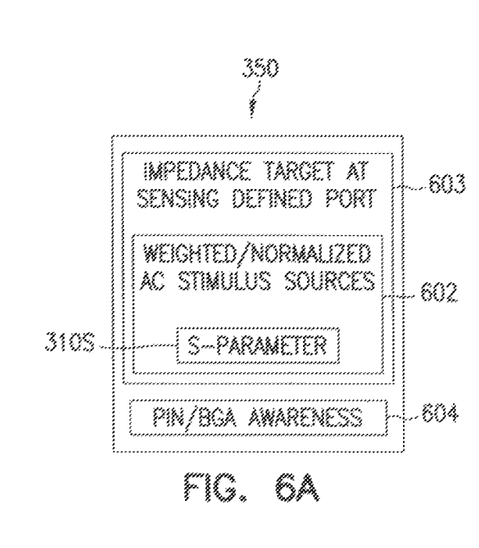
FIG. 6A shows detail of a package-level standard power integrity (PSPI) model the IC package of the system of FIG. 2, according to some embodiments described herein.

FIG. 5 shows a diagram 500 including elements presenting part of IC package 210 where part of the information contained in PSPI model 350 in FIG. 3 can be generated, according to some embodiments described herein. As shown in FIG. 5, diagram 500 can include S-parameter 310S (as also shown in FIG. 3), stimulus ports 1 through N, observation ports 1 through P, and connection ports (e.g., BGA ports) 1 through M. Stimulus ports 1 through N can include (or can correspond to) conductive connections (e.g., solder bumps) 214 of IC package 210 (FIG. 2). Observation ports 1 through P can be locations in system 200 (e.g., locations on IC package 210). Connection ports 1 through M can be locations at conductive connections (e.g., solder balls) 218 at IC package 210. As described in more detail with reference to FIG. 6A, stimulus ports 1 through N and observation ports 1 through P can be used as part of the operations to generate information in part of PSPI model 350 (FIG. 3 and FIG. 6A). Connection ports 1 through M can be used to generate information in another part of PSPI model 350.

FIG. 6A shows detail of PSPI model 350 including S-parameter 310S, and components (e.g., parameters) 602, 603, and 604 of IC package 210 (FIG. 2 and FIG. 3), according to some embodiments described herein. As shown in FIG. 6A, PSPI model 350 can include multiple components (e.g., four components including S-parameter 310S and three components 602, 603, and 604) in which S-parameter 310S is one of the multiple components (e.g., four components) of PSPI model 350. IC package 210 (FIG. 2) can include multiple power rails that can have different electrical specifications. S-parameter 310S (FIG. 3 and FIG. 6A) of PSPI model 350 can include S-parameter for conductive paths from conductive connections (e.g., solder balls) 218 of IC package 210 to conductive connections (e.g., solder bumps) 214 of IC package 210 (FIG. 2) for each power rail in IC package 210. Components 602, 603, and 604 of PSPI model 350 in FIG. 6A can include additional power model information of IC package 210, as described in more detail below.

The multiple components (S-parameter 310s and components 602, 603, and 604) of PSPI model 350 can improve overall platform PI design of system 200 (FIG. 2). Without PSPI model 350, platform PI design of system 200 can be relatively inefficient. For example, with only S-parameter 310S (without other components of PSPI model 350), it can be time-consuming for platform PI design, optimization, review and sign-off, intensive simulation (e.g., using software programs such as SPICE simulation program), and intensive manual involvement. As an example, an extracted board-level S-parameter usually includes a relatively large number of ports (e.g., over a hundred ports), which are susceptible to mistakes when setting up the simulation (e.g., using SPICE simulation program) decks for time-consuming massive what-if simulation to find the optimal PDN design solution. Further, the design process of a system such as system 200 (FIG. 2) may need involvement of dedicated power design engineers with extensive power design knowledge in platform PI design.

PSPI model 350 (FIG. 6A), having multiple components in addition to S-parameter, can provide more flexibility in platform PI design, besides copy exactly from reference design with platform design guidelines. PSPI model 350 can also provide effective platform PI optimization instead of doing manually massive what-if simulations. Further, PSPI model 350 can provide efficient platform PI design review and sign-off automation process instead of manually doing intensive PI simulations by platform electrical design engineers with PI expertise.

As shown in FIG. 6A, component 602 of PSPI model 350 can include information associated with weighted and normalized AC stimulus sources. The stimulus sources can include pre-defined stimulus sources, which can include stimulus ports 1 through N shown in FIG. 5. IC package 210 (FIG. 2) can have specific current loadings at respective locations, such as at stimulus ports 1 through N in FIG. 5, that can correspond to respective conductive connections (e.g., solder bumps) 214 at die 212 of IC package 210. These specific current loadings are chip-level actual current loadings that can be based on circuitry design of die 212 of IC package 210. In PSPI model 350 of FIG. 6A, the weighted and normalized AC sources in component 602 can include weighted and normalized values based on the actual values of the chip-level current loadings of die 212. Providing weighted and normalized values (instead of actual values) in component 602 of PSPI model 350 for modeling PDN of system 200 allows both protecting sensitive intellectual properties of die 212 and providing useful information for modeling PDN of system 200.

The weighted and normalized values of component 602 of PSPI model 360 (FIG. 6A) can be generated based on the elements of diagram 500 of FIG. 5. As an example, generating the weighted and normalized values can include applying AC current to stimulus ports 1 through N in FIG. 5, and then measuring the voltage (e.g., V(t)) at observation ports 1 through P responsive to the AC current applied at stimulus ports 1 through N. The resulting voltage can be interpreted as impedance Z(f) at the respective observation points, given the normalized total AC current stimulus sources. Z=V/I=V, when I=1. Example formats (e.g., text file) of weighted and normalized AC stimulus sources of component 602 are described below with reference to FIG. 6B.

In FIG. 6A, component 603 of PSPI model 600 can include information containing design impedance target of IC package 210. The impedance target can be pre-defined impedance at observation ports 1 through P in FIG. 5. The impedance target can be selected based on impedance curves described above with reference to FIG. 4. For example, the impedance target included in component 603 can be based on impedance curve 425 of FIG. 4. The impedance target can be scalable, supporting platform design trade-off among performance and cost. The impedance target is further described in more details with reference to FIG. 7.

In FIG. 6A, component 604 of PSPI model 350 can include information associated with conductive connections 218 of IC package 210 (FIG. 2). A conventional package-level S-parameter lacks pin awareness information (e.g., lacks pin-to-port mapping information). Therefore, manual pin setup is usually performed as part of platform PI design. This can be timing consuming and can lead to pin setup errors. In contrast, as shown in FIG. 6A, component 604 of PSPI model 350 includes pin (or BGA) awareness information that can include a mapping (e.g., pin-to-port mapping information) between package-level conductive connections (e.g., pin/BGA) of IC package 210 and board-level connections. This can support a direct (e.g., automatic) merging of PSPI model 350 as a virtual package physical database with board-level physical database. This merging (e.g., pin to port merging) can avoid manual pin setup (e.g., pin hookup) and pin setup errors. Thus, the pin awareness information contained in component 604 of PSPI model 350 can facilitate design automation in EDA power integrity design tools (e.g., in EDA application 140) that can lead to more efficient pin setup task and reduced pin setup errors.

Figure 6B:
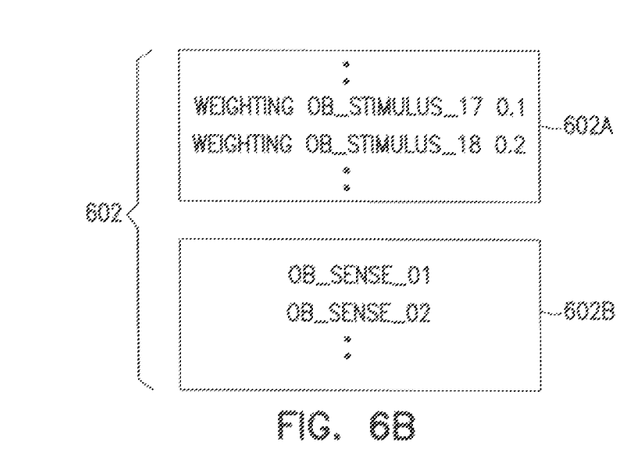
FIG. 6B shows examples of information contained in a component the PSPI model of FIG. 6A, according to some embodiments described herein.

FIG. 6B shows examples of information contained in component 602 of PSPI model 350 of FIG. 6A, according to some embodiments described herein. As shown in FIG. 6B, component 602 can include different portions (e.g., text portions) 602A and 602B. Each of portions 602B and 602 can include terms (e.g., text having specific format) that contain information for specific elements (e.g., pins of IC package 210). For example, as shown in FIG. 6B, portion 602A can include terms (e.g., key words) "Weighting OB_Stimulus_17 0.1" and "Weighting OB_Stimulus_18 0.2". In another example, portion 602B can include terms (e.g., key words) "OB_Sense_01" and "OB_Sense_02". FIG. 6B shows four terms as an example. However, each of portions 602A and 602B can include more than two terms in which the number of terms can be based on the number of conductive connections (e.g., pins) of IC package 210, In FIG. 6B, the term "Weighting OB_Stimulus_17 0.1" indicates that a current (e.g., like current Icct in FIG. 3) at port OB_stimulus_17 (e.g., port number 17 among the N stimulus ports in FIG. 5) is 10% (0.1) of total current on the concerned PDN. Similarly. "Weighting OB_Stimulus_18 0.2" that a current (e.g., like current Icct in FIG. 3) at port OB_stimulus_18 (e.g., port number 18 among the N stimulus ports in FIG. 5) is 20% (0.2) of total current on the concerned PDN.

The term "OB_Sense_01" indicates a location of a sense port (port OB_Sense_01) among the P sense ports in FIG. 5 where a scalable design impedance target will be defined. Similarly, the term "OB_Sense_02" indicates a location of another sense port (port OB_Sense_02) among the P sense ports in FIG. 5 where a scalable design impedance target will be defined.

Specific words and formats of the terms in portions 602A and 602B are examples. Alterative (e.g., different) words, formats, or both can be used as information included in component 602 of PSPI model 350 as long as such information can provide package-level PI design collaterals and can be recognized and used by an FDA design tool (e.g., FDA application 140) for platform PI design associated with system 200.

Figure 7:
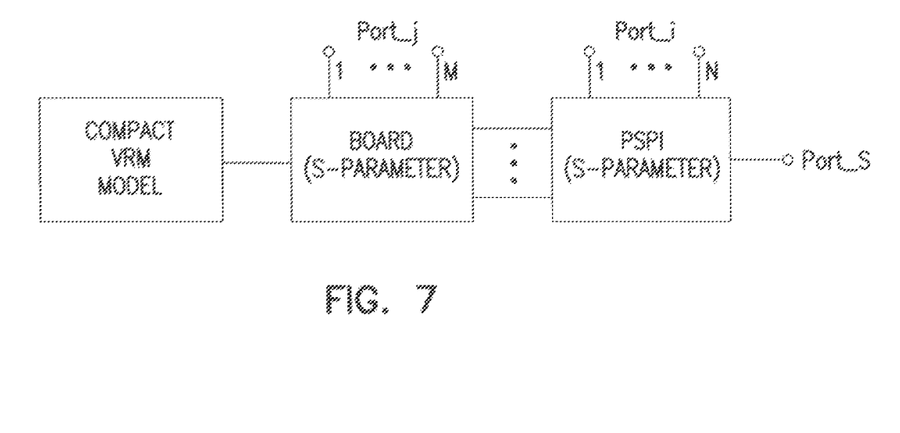
FIG. 7 shows a diagram illustrating PI design impedance target definition, according to some embodiments described herein.

FIG. 7 shows a diagram 700 illustrating PI design impedance target definition associated with information provided by component 603 of PSPI model 350 of FIG. 6, according to some embodiments described herein. In FIG. 7, compact VRM model represents a compact model of VRM 220 of FIG. 2. With PSPI model 350, the PI design impedance target can be selected based on the diagram 700 (as also described above in association with impedance curves 400, 405, 415, and 425 of FIG. 4).

In FIG. 7, ports having labels Port_j (including 1 through M ports) are for stuffing, or for not stuffing, board-level various capacitors. Ports having labeled Port_i (including 1 through N ports) are for stuffing all package-level necessary capacitors in-default. The port having labeled Port_S is one example of the sense ports (including 1 through P ports), which is for observing impendence as OB_Sense port.

The impedance at port_s (sense port) could be extended down to DC with the compact VRM model to be a unified power integrity target (UPIT), and covering both computing rails and IO power supply rails.

$[S_{pdn}]$ is transformed into $[Z_{pdn}]$, in EDA tool $[V]=[Z_{pdn}][I]$ $[V]=[v_1,v_2,\ldots,v_N,v_S]^T$ $[I]=[w_1,w_2,\ldots,w_N,0]^T$ $$\sum_{i=1}^{i=N} w_i = 1,$$

normalized weightings $$Z_s = V_s = \sum_{i=1}^{i=N+1}(Z_{pdn(N+1)}i^{*w_i})$$

$$Z_s = \sum_{i=1}^{i=N}(Z_{pdn(N+1)}, i^{*w_i})$$

In the above formulas, [Spdn] represents S-parameter of the concerned PDN. [V] represents voltage vector, where $V_1$, $V_2$, and $V_N$ are voltages at respective OB_stimulus Ports, and $V_S$ is a voltage at Sense Port [I] represents current stimulus vector, where $w_1$, $w_2$, $w_N$, 0 are weighting at OB_stimulus1, OB_stimulus_2, and OB_stimulusN, respectively, Σ is a sum that lumps all multiples together. Normalized weightings mean that all weightings add up to be exactly 1 $Z_S$ represents the impedance observed at OB_Sense port.

Figure 8A:
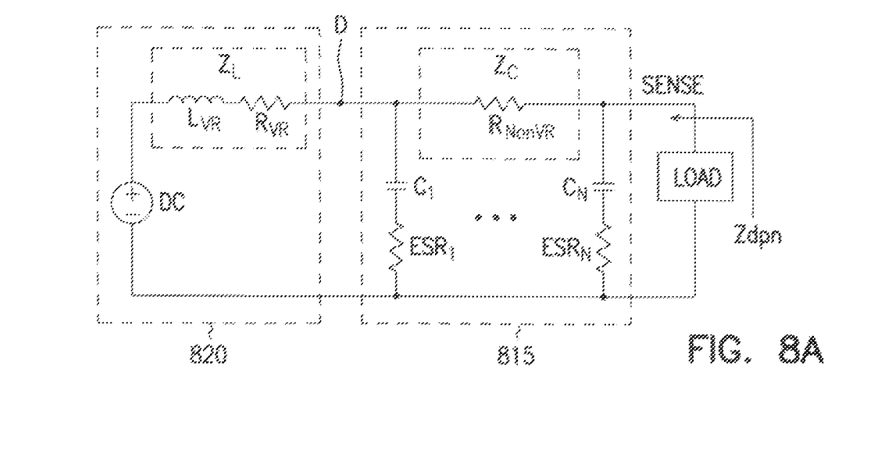
FIG. 8A shows a simplified PDN of the system of FIG. 2 including a compact VRM model, according to some embodiments described herein.
Figure 8B:
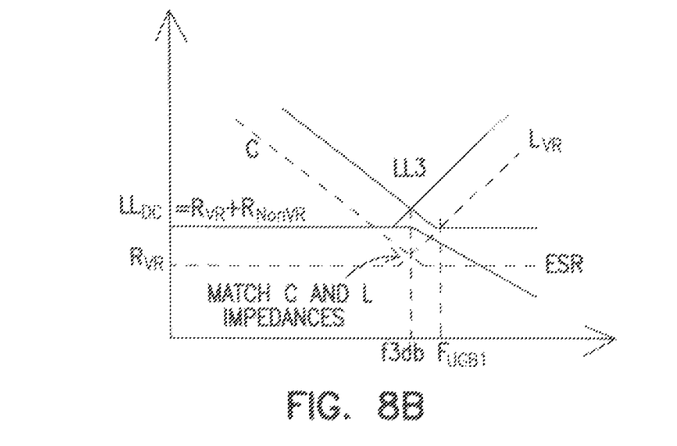
FIG. 8B and FIG. 8C are graphs showing relationships between resistance and frequency of some of the components of FIG. 8A.
Figure 8C:
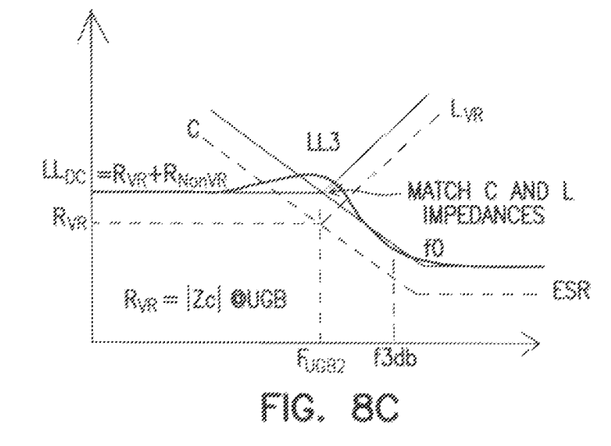

FIG. 8A shows a simplified PDN of system 200 of FIG. 2 including a compact VRM model, according to some embodiments described herein. FIG. 8B and FIG. 8C are graphs showing relationships between resistance and frequency of some of the components of FIG. 8A. In FIG. 8A, portion 815 represents a model of a portion of system 200 between node A and node D (FIG. 3) that includes a combination of a portion of IC package 210 (FIG. 2) and a portion of circuit board 205. Portion 815 can include part of PSPI model 350 (FIG. 6A). Portion 815 in FIG. 8A can include S-parameter of system 200 between nodes A and node D (FIG. 3). Portion 820 in FIG. 8A represents a compact VRM model for VRM 220 of FIG. 2.

As described above, PSPI model 350 can provide improvements and benefits for platform PI design. However, a simple and accurate VRM model at the sourcing end, in addition to PSPI model 350 at the loading end, can further improve platform PI design in achieving optimal PDN for a system such as system 200 (FIG. 2). The described compact VRM model with reference to FIG. 8A, FIG. 8B, and FIG. 8C can be used in part of platform PI design for a system such as system 200. The compact VRM model includes an iteration algorithm that can support real-time compact VRM model update for efficiently achieving platform level cost and/or performance optimal PDN.

PDN design often has two major segments that include power delivery (PD) and power integrity (PI). PD design focusing on below 1 MHz frequency range is usually settled down in the time domain in terms of transient droop/undershoot and over-shoot target with given di and dt information. PI design focusing beyond the 1 MHz frequency range is usually settled down with impedance target in frequency domain. PI design is preferred to extend the frequency below 1 MHz down to DC, with a VRM model included in PI design.

Conventional VRM models are usually provided by VRM manufacturers in simulation software programs (e.g., in SPICE netlist or in Simplis format). Such conventional VRM models are mainly for PD design in the time domain, focusing on selecting proper bulk inductors and bulk capacitors and other key components surrounding VRM controller. Some conventional VRM models use 2-element RL model or 4-element RL model, with the R and L values being measured from the well-designed and active VRM module on a board. The conventional VRM models normally work well with lumped RLC PDN model or the behavior PDN model which need to be converted from the original platform PI S-parameter model in a third-party EDA tool. The conventional VRM models normally work in the time domain, which is very inefficient in comparison with platform PI design, which is implemented in the frequency domain directly with S parameter models. Therefore, conventional VRM models very ineffective for closed loop PI designs in many high performance systems. Further, measured 2-element RL model and 4-element RL model can be hard to obtain on each of the actual platform during PDN design stage because RL values should be dependent on the platform PI.

A compact nominal VRM model, as described below with reference to FIG. 8A, FIG. 8B, and FIG. 8C, derived with platform S-parameter model is applicable to facilitate PDN design from PI design perspective effectively and efficiently, to settle down the impedance extended below 1 MHz down to DC holistically. The described compact VRM modeling algorithm can quickly calculate (e.g., update) RL values (e.g., $R_{VR}$ and $L_{VR}$ values in FIG. 8A) for corresponding platforms to address the VRM RL values dependency upon the actual PDN routing and capacitors (e.g., stuffing capacitors) with known VRM bandwidth. In the described compact VRM model, RL values iterating algorithm can be integrated into platform PI design that includes PSPI model 350 (described above). The RL values (e.g., $R_{VR}$ and $L_{VR}$ values in FIG. 8A) can be updated automatically (e.g., in real-time) during platform PI design optimization that can lead to more accuracy in AC load line (ACLL3) calculation during achieving cost optimal PDN, with known VRM bandwidth.

As shown in FIG. 8A, a first-order PDN can be simplified to be $Z_L$ and $Z_C$. $Z_L$ represents the equivalent of VRM 220 (FIG. 2) in open loop with bulk inductors. $Z_C$ represents the PDN from node D (FIG. 3) between bulk inductors and sense node (labeled "Sense" in FIG. 8A), including all capacitors. The impedance curves of Zpdn of $Z_C$ observed from sense node and $Z_L$ from node D are shown in FIG. 8A.

In the equations below, ESR (in Eq. 1-1) refers to the equivalent series resistance, and Ctot (in Eq. 1-20) refers to the total capacitance. $F_{UGB1}$ and $F_{UGB2}$ are unity gain bandwidths of VRM 220 (called "VR" for short) represented by portion 820 of FIG. 8A.

As shown in FIG. 8B, when VR unity gain bandwidth $F_{UGB1}$ is higher than $Z_C$ 3 db frequency bandwidth (BW) f3 db, i.e., $F_{UGB1}$>f3 db.

$$R_{VR} = ESR = |Zc|, \text{ at } F_{UGB1}, \quad \text{(Eq. 1-1)}$$

$$L_{VR}/R_{VR} = ESR * Ctot = 1/(2\pi^* F_{UGB1}) \quad \text{(Eq. 1-2)}$$

As shown in FIG. 8C, when VR unity gain bandwidth $F_{UGB2}$ is lower than $Z_C$ 3 db frequency BW f3 db, i.e., $F_{UGB2}$<f3 db, Eq. 1-1 & 1-2 is derived to $$R_{VR} = |Zc|, \text{ at } F_{UGB2} \quad \text{(Eq. 2-1)}$$

$$L_{VR} = R_{VR}/(2\pi^* F_{UGB2}) \quad \text{(Eq. 2-2)}$$

$L_{VR}$ and $R_{VR}$ (FIG. 8A) values are largely dependent on $Z_C$, composed of board-level PDN that includes bulk capacitors of PSPI model 350 of IC package 210. In platform PI design (as shown in FIG. 8A), $L_{VR}$ and $R_{VR}$ values can be simulated using a known $F_{UGB}$ of a well-designed physical VRM, and $Z_C$ including PSPI model 350, as shown below in activities (e.g., calculations) 1 through 4.

Calculation 1, calculate Rdc from Sense to Port_VRM (Node D in FIG. 8A) short to ground (e.g., in SPICE simulator)

Rdc=|ZSpdn (DC)|, with short at Port_VRM.

Calculation 2, calculate Z(f) from Sense to Port_VRM (Node_D in FIG. 8A) open, in SPICE simulator

|ZOpdn ($F_{UGB}$)|, with open at Port_VRM (Node_D as shown in FIG. 8A)

Calculation 3, calculate $R_{VR}$ and $L_{VR}$ $$R_{VR}=|ZOpdn(F_{UGB})|-Rdc \qquad \text{(Eq. 3-1)}$$

$$L_{VR}=R_{VR}/(2\pi*F_{UGB}) \qquad \text{(Eq. 3-2)}$$

Calculation 4, set up proper DCLL for calculating the most accurate ACLL.

$$DCLL = R_{VR} + Rdc = |ZOpdn\ (F_{UGB})| \qquad \text{(Eq. 3-3)}$$

Zpdn≈$Z_L$/ZOpdn, as holistically shown in FIG. 8.

The actual Zpdn can be simulated in a simulator (e.g., SPICE circuit simulator).

In a compact VRM model as described above, a nominal VRM model (e.g., nominal $R_{VR}$ and $L_{VR}$ values in FIG. 8A) for each particular power delivery network (PDN) can be provided to customers (e.g., manufacturer of system 200) as one of the standard deliverables, together with PSPI model 350, facilitating customers platform PI design and optimization effectively and efficiently. For example, the quantity (number) of capacitors (e.g., board-level stuffing capacitors) can be changed (e.g., increased or decreased) during platform PI simulation optimization. Changing the capacitors can be done by removing (or adding) capacitors at Port_j (FIG. 7). The nominal $R_{VR}$ and $L_{VR}$ values of the compact VRM model (FIG. 8A) are automatically updated (based on the VRM modeling algorithm) responsive to the change in the quantity of capacitors.

The described compact VRM modeling algorithm (described above) can be integrated into EDA power integrity design tools (e.g., in EDA application 140) for PI design. With the compact VRM modeling algorithm and PSPI model 350 integrated into such EDA power integrity design tools, platform PI design can be more efficiently performed. Further, the described compact VRM modeling iterating algorithm can help customers achieving board-level cost optimal PDN, saving cost with relatively fewer capacitors, less routing area and/or cheaper stack-ups.

Figure 9:
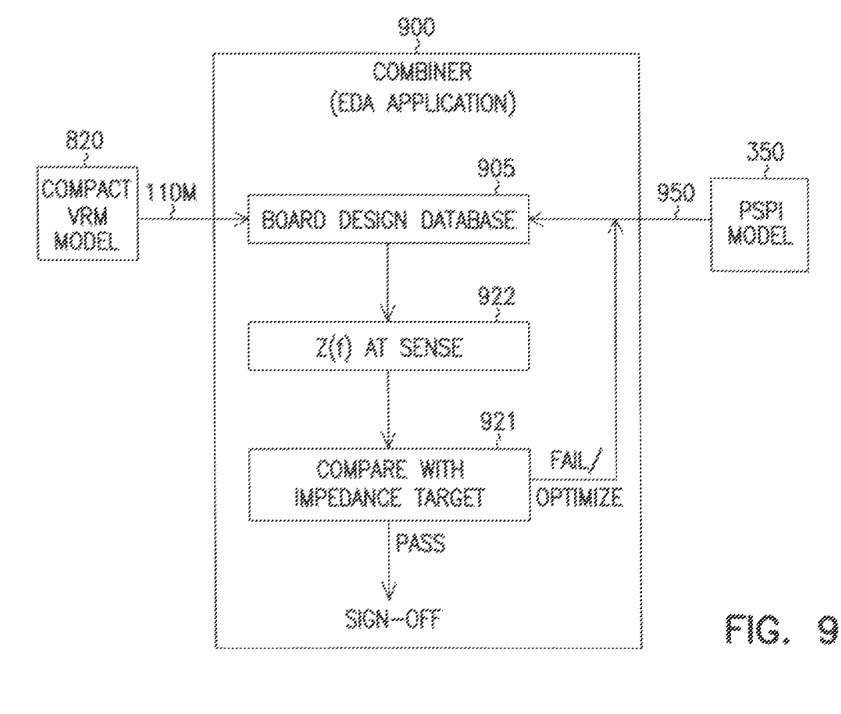
FIG. 9 shows a block diagram including a combiner, the VRM model of FIG. 8A, and the PSPI model of FIG. 6A, according to some embodiments described herein.

FIG. 9 shows a block diagram including a combiner 900, compact VRM model portion 820, and PSPI model 350, according to some embodiments described herein. In conventional platform PI design flow, PI simulation often runs with IC package S-parameter model, VRM model (e.g., in PSpice or Simplis), and board S-parameter model that are normally provided by different manufacturers. In such platform PI design flow, platform PI engineers manually perform the optimization, review, and sign-off by comparing with the PI design targets. Conventional platform PI review and sign-off are often only affordable to check physical equivalence in terms of BOM including capacitors and their placements since experienced resources to run PI simulation and understand the details of translating physical implementation to electrical parameters, such as impedance target, are usually lacking.

Such conventional platform PI design flow is low efficiency. It often involves intensive manual efforts for ports setup in 3D electrical-magnetic field modeling extraction, and correctly connecting a relatively large number of ports (e.g., hundreds of ports) in compiling decks for simulation (e.g., Spice simulation) in order to conduct PDN optimization. In conventional platform PI design flow, a tremendous amount of detail is generally needed by manually reviewing BOM and placement of capacitors. It also often leads to low accurate results. Typical PI collaterals from IC package manufacturers usually lack operating details (e.g., Icct current information) due to intellectual property protection concerns. Further, a conventional available VRM model (e.g., in Simplis model) is usually incompatible with original S-parameter models of package and circuit board. Further, a conventional IC package model often lacks the pre-defined AC stimulus for a PI design impedance target. Thus, platform PI design often results in over-designed PDN with extra BOM cost, or an underdesigned system that can lead to inefficient system operation (e.g., consuming unnecessary power, leading to shortened battery life).

As described above with reference to FIG. 2 through FIG. 7, PSPI model 350 of IC package 210 (FIG. 2) can be generated and include package-level S-parameter, weighted and normalized AC stimulus sources, scalable PI impedance target at the sensing port, and pin/BGA awareness. PSPI model 350 can provide sufficient PI collaterals for effective and efficient platform PI design optimization, design review and sign-off. As described above with reference to FIG. 8A, FIG. 8B, and FIG. 8C, compact VRM model of VRM 220 (FIG. 2) can be generated with an associated iteration algorithm to provide a nominal compact VRM model for a well-designed VRM with known switching frequency from the reference design board. The compact VRM model iteration algorithm enables updating key parameters (e.g., $R_{VR}$ and $L_{VR}$ values) of the compact VRM in real time during optimization, to achieve cost optimal PDN.

In FIG. 9, combiner 900 can be pan of a platform PI design flow (e.g., called "fast PI" flow) that can be configured to integrate (e.g., combine) the PSPI model 350 and compact VRM model into EDA commercial tools (e.g., EDA application 140). This fast PI flow can allow designers in platform PI design flow to effectively and efficiently optimize and sign off cost optimal PDN and time to market (TTM) designs.

As shown in FIG. 9, combiner 900 can include (or can be part of) an EDA application (e.g., EDA application 140 of FIG. 1). Combiner 900 can be configured with (e.g., can include) programming codes, which can be part of the programming codes of the EDA application. Combiner 900 can extract information provided by PSPI model 350 (e.g., through an input interface 950) and information provided by compact VRM model position 820 (e.g., through an input interface 920). Combiner 900 can also integrate the extracted information with board design database 905. Then, combiner 900 can perform platform PI design simulation until a target (e.g., optimal) PDN is achieved. For example, the processes in combiner 900 can include performing platform PI simulation for impedance at a sensing point (at operation 921) and comparing it with an impedance target (at operation 922) that can be a unified power integrity target (UPIT). The platform PI process can be repeated to optimize the PDN (or repeated if it fails to provide a target result). The PDN design can be signed off when the platform PI process passes or when the target result (e.g., optimal PDN design) is achieved.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements, item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

Additional Notes and Examples

Example 1 includes subject matter (such as a device, an electronic apparatus (e.g., circuit, electronic system, or both), or a machine) including at least one die, a package substrate, first conductive connections coupled between the die and a first side of the package substrate, and second conductive connections located on a second side of the package substrate opposite from the first side, the second conductive connections coupled to the first conductive connections through conductive paths in the package substrate, wherein the first conductive connections and the conductive connections are associated with an S-parameter of an electrical model of the integrated circuit package, and the electrical model further includes at least one of a current value associated with a power rail of the integrated circuit package, an impedance target associated with a location at the integrated circuit package, and a mapping associated with the first and second conductive connections.

In Example 2, the subject matter of Example 1 may optionally include, wherein the current value is at a stimulus source at a port of the electrical model of the integrated circuit package.

In Example 3, the subject matter of Example 1 may optionally include, wherein the port is associated one of the conductive connections.

In Example 4, the subject matter of Examples 1-3 may optionally include, wherein the impedance target is defined at an observation port of the electrical model of the integrated circuit package.

In Example 5, the subject matter of Examples 1-3 may optionally include, wherein the conductive connections include first conductive connections and second conductive connections, the first conductive connections are located between a die of the integrated circuit package and a first side of a package substrate of the integrated circuit, the second conductive connections are located between on a second side of the package substrate and opposite from the first side, and the mapping includes a mapping between the first conductive connections and the second conductive connections.

In Example 6, the subject matter of Examples 1-3 may optionally include, wherein the first conductive connections include solder bumps.

In Example 7, the subject matter of Example 1 may optionally include, wherein the second conductive connections include solder balls.

In Example 8, the subject matter of Example 7 may optionally include, wherein the solder bails are part of a ball grid array package.

Example 9 includes subject matter (such as a method of operating a device, an electronic apparatus (e.g., circuit, electronic system, or both), or a machine) including providing first information of an electrical model of an integrated circuit package, the first information including an S-parameter of a power net associated with conductive connections of the integrated circuit package, and providing second information of the electrical model, the second information including at least one of a current value associated with a power rail of the integrated circuit package, an impedance target associated with a location at the integrated circuit package, and a mapping associated with conductive connections of the integrated circuit package.

In Example 10, the subject matter of Example 9 may optionally include, wherein the current value is relative to a total value of current associated with the power rail.

In Example 11, the subject matter of Example 9 may optionally include, wherein the current value is a weighted value.

In Example 12, the subject matter of Examples 9-11 may optionally include, wherein the current value is a normalized value.

In Example 13, the subject matter of Example 9 may optionally include, wherein the first conductive connections include solder bumps, and the second conductive connections include solder balls.

In Example 14, the subject matter of Example 9 or 13 may optionally include, wherein the solder balls are part of a land grid array package.

Example 15 includes subject matter (such as a method of operating a device, an electronic apparatus (e.g., circuit, electronic system, or both), or a machine) including receiving first information of an electrical model of an integrated circuit package, the first information including an S-parameter of a power net associated with conductive connections of the integrated circuit package, receiving second information of the electrical model, the second information including at least one of a current value associated with a power rail of the integrated circuit package, an impedance target associated with a location at the integrated circuit package, and a mapping associated with conductive connections of the integrated circuit package, and performing a power integrity simulation based on the first information and the second information.

In Example 16, the subject matter of Example 15 may optionally include, wherein further comprising receiving an electrical model of a circuit board, wherein performing the power integrity simulation includes performing a board-level power integrity simulation based on the first information, the second information, and the electrical model of the circuit board.

In Example 17, the subject matter of Example 15 may optionally include, further comprising receiving an electrical model of a circuit board, and receiving an electrical model of a voltage regulator module, and wherein performing the power integrity simulation includes performing a board-level power integrity simulation based on the first information, the second information, the electrical model of the voltage regulator module, and the electrical model of the circuit board.

In Example 18, the subject matter of Example 17 may optionally include, wherein a nominal value of an inductor of the electrical model of the voltage regulator module, and a nominal value of a resistor of the electrical model of the voltage regulator module.

In Example 19, the subject matter of Example 18 may optionally include, wherein changing the nominal value of the inductor during the power integrity simulation to obtain an updated inductor value, and changing the nominal value of the resistor during the power integrity simulation to obtain an updated resistor value.

In Example 20, the subject matter of Example 19 may optionally include, wherein changing the nominal value of the inductor and the nominal value of the resistor are based on changing a quantity of capacitors coupled to ports of the electrical model of the circuit board during the power integrity simulation.

Example 21 includes subject matter (such as a device, an electronic apparatus (e.g., circuit, electronic system, or both), or a machine) including receiving first information of an electrical model of an integrated circuit package, the first portion including an S-parameter of a power net associated with conductive connections of the integrated circuit package, receiving second information of the electrical model, the second information including at least one of a current value associated with a power rail of the integrated circuit package, an impedance target associated with a location at the integrated circuit package, and a mapping associated with conductive connections of the integrated circuit package, and performing a power integrity simulation based on the first and second information.

In Example 22, the subject matter of Example 21 may optionally include, wherein the operations further comprise receiving an electrical model of a circuit board, wherein performing the power integrity simulation includes performing a board-level power integrity simulation based on the first and second information of the electrical model of the integrated circuit and the electrical model of the circuit board.

In Example 23, the subject matter of Example 21 may optionally include, wherein the operations further comprise receiving an electrical model of a circuit board, and receiving an electrical model of a voltage regulator module, and wherein performing the power integrity simulation includes performing a board-level power integrity simulation based on the first and second information of the electrical model of the integrated circuit, the electrical model of the voltage regulator module, and the electrical model of the circuit board.

In Example 24, the subject matter of Example 23 may optionally include, wherein the electrical model of the voltage regulator includes a nominal value of an inductor of the electrical model of the voltage regulator module, and receiving an electrical model of a circuit board, and receiving an electrical model of a voltage regulator module, and wherein performing the power integrity simulation includes performing a board-level power integrity simulation based on the first and second information of the electrical model of the integrated circuit, the electrical model of the voltage regulator module, and the electrical model of the circuit board.

In Example 25, the subject matter of Example 24 may optionally include, wherein operations further comprise changing the nominal value of the inductor during the power integrity simulation to obtain an updated inductor value, and changing the nominal value of the resistor during the power integrity simulation to obtain an updated resistor value.

The subject matter of Example 1 through Example 25 may be combined in any combination.

The above description and the drawings illustrate some embodiments to enable those skilled in the art to practice the embodiments of the invention. Other embodiments may incorporate structural, logical, electrical, process, and other changes Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

What is claimed is:

1. An integrated circuit package comprising:
a die;
a package substrate;
first conductive connections coupled between the die and a first side of the package substrate;
second conductive connections located on a second side of the package substrate opposite from the first side, the second conductive connections coupled to the first conductive connections through conductive paths in the package substrate, wherein the first conductive connections and the conductive connections are associated with an S-parameter of an electrical model of the integrated circuit package, and the electrical model further includes at least one of a current value associated with a power rail of the integrated circuit package, an impedance target associated with a location at the integrated circuit package, and a mapping associated with the first and second conductive connections; and
a voltage regulator module coupled to the second conductive connections through a circuit board, wherein the voltage regulator module is part of a power delivery network, wherein the power delivery network is associated with at least one of an S-parameter of the voltage regulator module and an S-parameter of the circuit board.

2. The integrated circuit package of claim 1, wherein the current value is at a stimulus source at a port of the electrical model of the integrated circuit package.

3. The integrated circuit package of claim 2, wherein the port is associated one of the conductive connections.

4. The integrated circuit package of claim 1, wherein the impedance target is defined at an observation port of the electrical model of the integrated circuit package.

5. The integrated circuit package of claim 1, wherein the conductive connections include first conductive connections and second conductive connections, the first conductive connections are located between a die of the integrated circuit package and a first side of a package substrate of the integrated circuit, the second conductive connections are located between on a second side of the package substrate and opposite from the first side, and the mapping includes a mapping between the first conductive connections and the second conductive connections.

6. The integrated circuit package of claim 1, wherein the first conductive connections include solder bumps.

7. The integrated circuit package of claim 1, wherein the second conductive connections include solder balls.

8. The integrated circuit package of claim 7, wherein the solder balls are part of a ball grid array package.

9. A method for providing an electrical model, the method comprising:
providing first information of an electrical model of an integrated circuit package, the first information including an S-parameter of a power net associated with conductive connections of the integrated circuit package;

providing second information of the electrical model, the second information including at least one of a current value associated with a power rail of the integrated circuit package, an impedance target associated with a location at the integrated circuit package, and a mapping associated with conductive connections of the integrated circuit package;

providing an electrical model of a circuit board;

providing an electrical model of a voltage regulator module; and performing a power integrity simulation based on the first information, the second information, the electrical model of the voltage regulator module, and the electrical model of the circuit board.

10. The method of claim 9, wherein the current value is relative to a total value of current associated with the power rail.

11. The method of claim 9, wherein the current value is a weighted value.

12. The method of claim 9, wherein the current value is a normalized value.

13. The method of claim 9, wherein the first conductive connections include solder bumps, and the second conductive connections include solder balls.

14. The method of claim 9, wherein the solder balls are part of a land grid array package.

15. A computer-implemented method comprising:

receiving first information of an electrical model of an integrated circuit package, the first information including an S-parameter of a power net associated with conductive connections of the integrated circuit package;

receiving second information of the electrical model, the second information including at least one of a current value associated with a power rail of the integrated circuit package, an impedance target associated with a location at the integrated circuit package, and a mapping associated with conductive connections of the integrated circuit package;

performing a power integrity simulation based on the first information and the second information;

receiving an electrical model of a circuit board; and receiving an electrical model of a voltage regulator module; and wherein performing the power integrity simulation includes performing a board-level power integrity simulation based on the first information, the second information, the electrical model of the voltage regulator module, and the electrical model of the circuit board.

16. The computer-implemented method of claim 15, wherein the electrical model of the voltage regulator includes:

a nominal value of an inductor of the electrical model of the voltage regulator module, and a nominal value of a resistor of the electrical model of the voltage regulator module.

17. The computer-implemented method of claim 16, wherein performing the power integrity simulation includes:

changing the nominal value of the inductor during the power integrity simulation to obtain an updated inductor value; and changing the nominal value of the resistor during the power integrity simulation to obtain an updated resistor value.

18. The computer-implemented method of claim 17, wherein changing the nominal value of the inductor and the nominal value of the resistor are based on changing a quantity of capacitors coupled to ports of the electrical model of the circuit board during the power integrity simulation.

19. A non-transitory computer readable storage medium having a plurality of instructions stored thereon, which, when executed by a processor, cause the processor to perform operations comprising:

receiving first information of an electrical model of an integrated circuit package, the first portion including an S-parameter of a power net associated with conductive connections of the integrated circuit package;

receiving second information of the electrical model, the second information including at least one of a current value associated with a power rail of the integrated circuit package, an impedance target associated with a location at the integrated circuit package, and a mapping associated with conductive connections of the integrated circuit package;

performing a power integrity simulation based on the first and second information receiving an electrical model of a circuit board; and receiving an electrical model of a voltage regulator module; and wherein performing the power integrity simulation includes performing a board-level power integrity simulation based on the first and second information of the electrical model of the integrated circuit, the electrical model of the voltage regulator module, and the electrical model of the circuit board.

20. The non-transitory computer readable storage medium of claim 19, wherein the electrical model of the voltage regulator includes:

a nominal value of an inductor of the electrical model of the voltage regulator module, and a nominal value of a resistor of the electrical model of the voltage regulator module.

21. The non-transitory computer readable storage medium of claim 20, wherein the operations further comprise:

changing the nominal value of the inductor during the power integrity simulation to obtain an updated inductor value; and changing the nominal value of the resistor during the power integrity simulation to obtain an updated resistor value.

* * * * *